United States Patent [19]

DeSantis et al.

[11] Patent Number: 5,244,395
[45] Date of Patent: Sep. 14, 1993

[54] CIRCUIT INTERCONNECT SYSTEM

[75] Inventors: John A. DeSantis, North Lauderdale; Peter E. Albertson, Cooper City, both of Fla.

[73] Assignee: Motorola, Inc., Schaumburg, Ill.

[21] Appl. No.: 921,161

[22] Filed: Jul. 29, 1992

[51] Int. Cl.⁵ .................................. H01R 9/09
[52] U.S. Cl. ............................. 439/65; 439/67
[58] Field of Search ........................ 439/65-67, 439/91, 591

[56] References Cited

U.S. PATENT DOCUMENTS

| | | | |
|---|---|---|---|
| 4,762,499 | 8/1988 | Johnson, Jr. | 439/66 |
| 4,823,233 | 4/1989 | Brown et al. | 439/65 |
| 4,834,660 | 5/1989 | Cotti | 439/65 |
| 4,922,191 | 5/1990 | Conover | 439/65 |
| 4,997,377 | 3/1991 | Goto et al. | 439/67 |
| 5,101,323 | 3/1992 | Prevost | 439/65 |
| 5,110,298 | 5/1992 | Dorinski et al. | 439/65 |
| 5,119,273 | 6/1992 | Corda | 439/65 |
| 5,122,064 | 6/1992 | Zarreii | 439/65 |

Primary Examiner—Paula A. Bradley
Attorney, Agent, or Firm—Dale W. Dorinski

[57] ABSTRACT

A circuit interconnect system comprises a circuit pattern (22) on a rigid insulating sheet (17), forming a first circuit carrying substrate (12). A portion of the circuit pattern wraps around an edge of the insulating sheet and continues onto a vertical wall (20) of the sheet to provide a contact surface (24). An electrically conductive portion (16) of a second member (14) is mated to the first circuit carrying substrate by aligning the contact surface to the electrically conductive portion. An electrically conductive resilient material such as a conductive elastomer (35) or metal spring (35) provides electrical interconnection between the circuit pattern and the electrically conductive portion.

15 Claims, 4 Drawing Sheets

CIRCUIT INTERCONNECT SYSTEM

TECHNICAL FIELD

This invention relates generally to a system for interconnecting circuit boards and more particularly to a system capable of providing a separable interface between two electronic assemblies.

BACKGROUND

Electronics packages, from personal computers to two-way radios and super computers, with more than one printed circuit card or board require that each of the boards be interconnected. Cables having connectors on either end are typically used to achieve some of these interconnections. Connectors are also used to permit functional units, such as the circuit boards, to be individually inserted and removed for testing, to reduce manufacturing costs, to facilitate repair, and to provide changes in the field.

A connector is defined as a device to repeatedly separate and re-connect pathways in an electronic system. This definition applies equally well to connectors for power or ground signals. The two elements being connected may be alike or dissimilar. Typically, connections of importance are printed circuit board-to-printed circuit board, printed circuit board-to-flex circuit, printed circuit board-to-flat cable, or printed circuit board-to-power supply.

Typically in the prior art, a card edge connector has been used to connect one circuit board to another. The connector is typically a discrete part that is soldered to holes in the printed circuit board and has spring fingers or other types of compliant members to electrically contact the second printed circuit board and maintain contact pressure on the electrical interconnection. Most card-edge connectors utilize one or both of the parallel major surfaces of the printed circuit board as a contact surface for the electrical interconnection. This requires that a certain amount of "real state" on the printed circuit board surface be dedicated to the card-edge connector system. An equivalent amount of real estate must also be allocated on the back side of the printed circuit board, whether or not there are electrical signals present.

It would be highly desirable if the method of interconnecting a printed circuit board to another assembly could be found that would not require the dedication of any real estate on the circuit board surface.

SUMMARY OF THE INVENTION

Briefly, according to the invention, there is provided a circuit interconnect system. A circuit pattern on a rigid insulating sheet comprises a first circuit carrying substrate. A portion of the circuit pattern wraps around an edge of the insulating sheet and continues onto a vertical wall of the sheet to provide a contact surface. An electrically conductive portion of a second member is mated to the first circuit carrying substrate by aligning the contact surface to the electrically conductive portion to provide electrical interconnection between the circuit pattern and the electrically conductive portion.

The preferred embodiment of the invention additionally employs an electrically conductive resilient member between the contact surface on the first circuit carrying substrate and the conductive portions of the second member.

DETAILED DESCRIPTION OF THE PREFERRED EMBODIMENT

Figure 1:
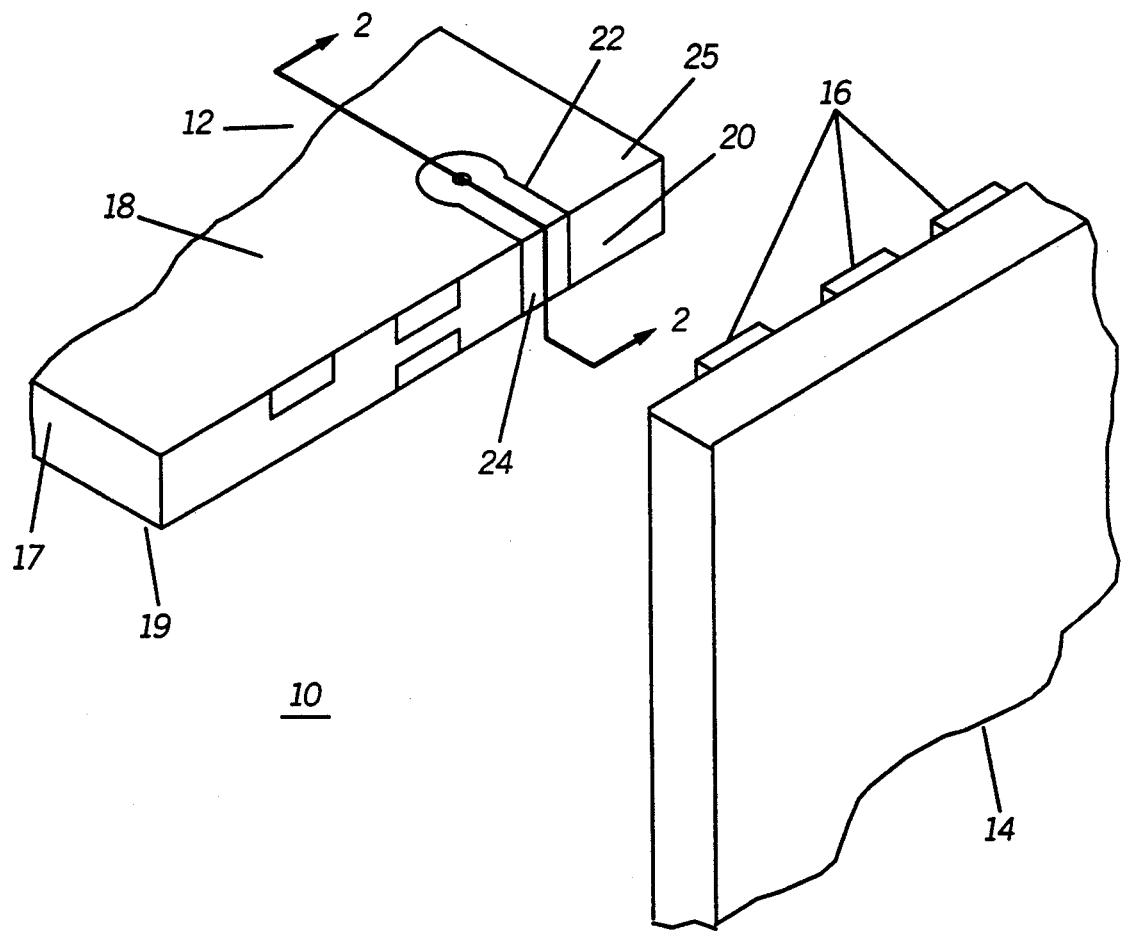
FIG. 1 is an isometric view of the circuit interconnect system in accordance with the present invention.

While the specification concludes with claims defining the features of the invention that are regarded as novel, it is believed that the invention will be better understood from a consideration of the following description in conjunction with the drawing figures, in which like reference numerals are carried forward. Referring now to FIG. 1, A circuit interconnect system 10 is formed by interconnecting a rigid printed circuit board (PCB) 12 to another member 14 having an electrically conductive portion 16. The printed circuit board or PCB 12 is typically made of a rigid insulating sheet 17 such as epoxy, polyester, or polyimide resin with glass reinforcement. The PCB 12, being a sheet-like structure, typically has two major surfaces 18 and 19 that serve to form opposite sides of the sheet. Of additional interest is a vertical surface 20 that typically forms an edge of the sheet connecting the first major surface 18 with the second major surface 19. The PCB 12 also contains a circuit pattern 22 that may be formed on either one of the major surfaces or may also be embedded in the interior of the PCB. The circuit pattern 22 may take on many forms, such as signal or ground planes, and these and other configurations are well known to those skilled in the art. Circuit pattern 22 is connected to a contact surface 24 formed on the vertical surface 20 of the PCB. In the simplest configuration, the circuit pattern 22 is connected to the contact surface 24 by plating around an edge 25 of the PCB. The contact surface 24 is then mated to the electrically conductive portion 16 of the member 14 by physically contacting PCB 12 to the member 14. As can be seen in FIG. 1, the contact between the two members is such that the major surfaces of the PCB 12 are perpendicular to the electrically conductive portion 16 of the member 14. It should be apparent to the reader that the electrical interconnect system in accordance with the invention does not require any additional components, such as card-edge connectors or cable connectors, to interconnect the circuit board with additional members. The electrically conductive portion 16 on the member 14 may be well-defined circuit traces as shown in the drawing or may simply be a large conductive area. For example, the member 14 may be a dielectric material such as another circuit board or a plastic radio housing that has circuit traces imaged thereon. In certain situations, the member 14 might be a molded circuit board (MCB) that is a three dimensional member. MCB's are well known in the art, and are formed by, for example, injection molding a high temperature plastic such as polyetherimide and forming electrical circuit traces on the surface of the plastic. A reader skilled in the art will also appreciate that the member 14 may also be an electrical component, such as a transformer or power supply, that is directly connected to the PCB 12. In this way, an interconnection can be made that eliminates the use of discrete connectors, cables, and wires. The member 14 may also be totally conductive such as a metal frame for a two-way radio. In this case, the contact surfaces 24 of the PCB 12 would be grounded to the metal frame during the electrical interconnect. This can serve as a method of providing, for example, electromagnetic shielding to the printed circuit board, if desired.

Figure 2:
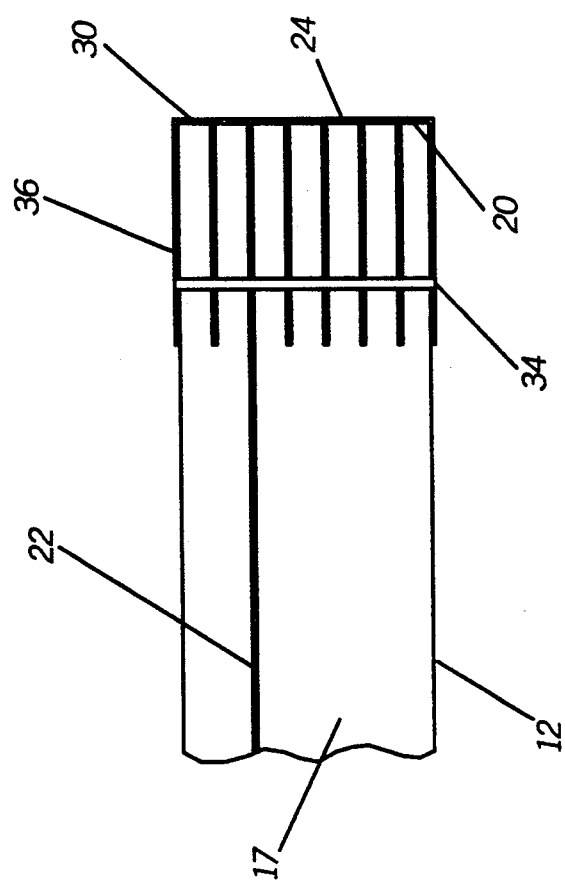
FIG. 2 is a cross-sectional view through section 2—2 of FIG. 1.

A preferred embodiment of the invention is shown in FIG. 2, a cross section through '2—2' of FIG. 1. The PCB 12 contains a circuit pattern 22 which may be a signal layer that extends out to the vertical surface 20 of the PCB. Additional circuit layers 30 are dispersed throughout the insulating sheet 17 and separated from the circuit pattern 22 by a portion of the insulating sheet 17. A plated hole 34 passes either part way or completely through the insulating sheet 17 and connects each of the additional circuit layers 30 to the circuit pattern 22. The circuit layers 30 also extend to the vertical surface 20 of the PCB 12 and are electrically interconnected to the contact surface 24. Thus, the circuit pattern 22 is not only directly connected at one point to the contact surface 24 but is also connected at multiple points by an electrical path established by the plated hole 34 and the additional circuit layers 30. The numerous redundant connections provided by this scheme serve to provide a much more reliable interconnection between the circuit pattern 22 and the vertical surface 24 than would be found if the circuit pattern were simply connected at one point. Thus, if a crack or opening should form in the plating between the circuit pattern 22 and the vertical surface 24, it will not serve to render the connection ineffective because of the redundant connections provided by the additional circuit layers 30. If desired, the plated hole 34 can also be connected to an annular ring or surface conductor 36 on the first and/or second major surface of the printed circuit board.

Figure 3:
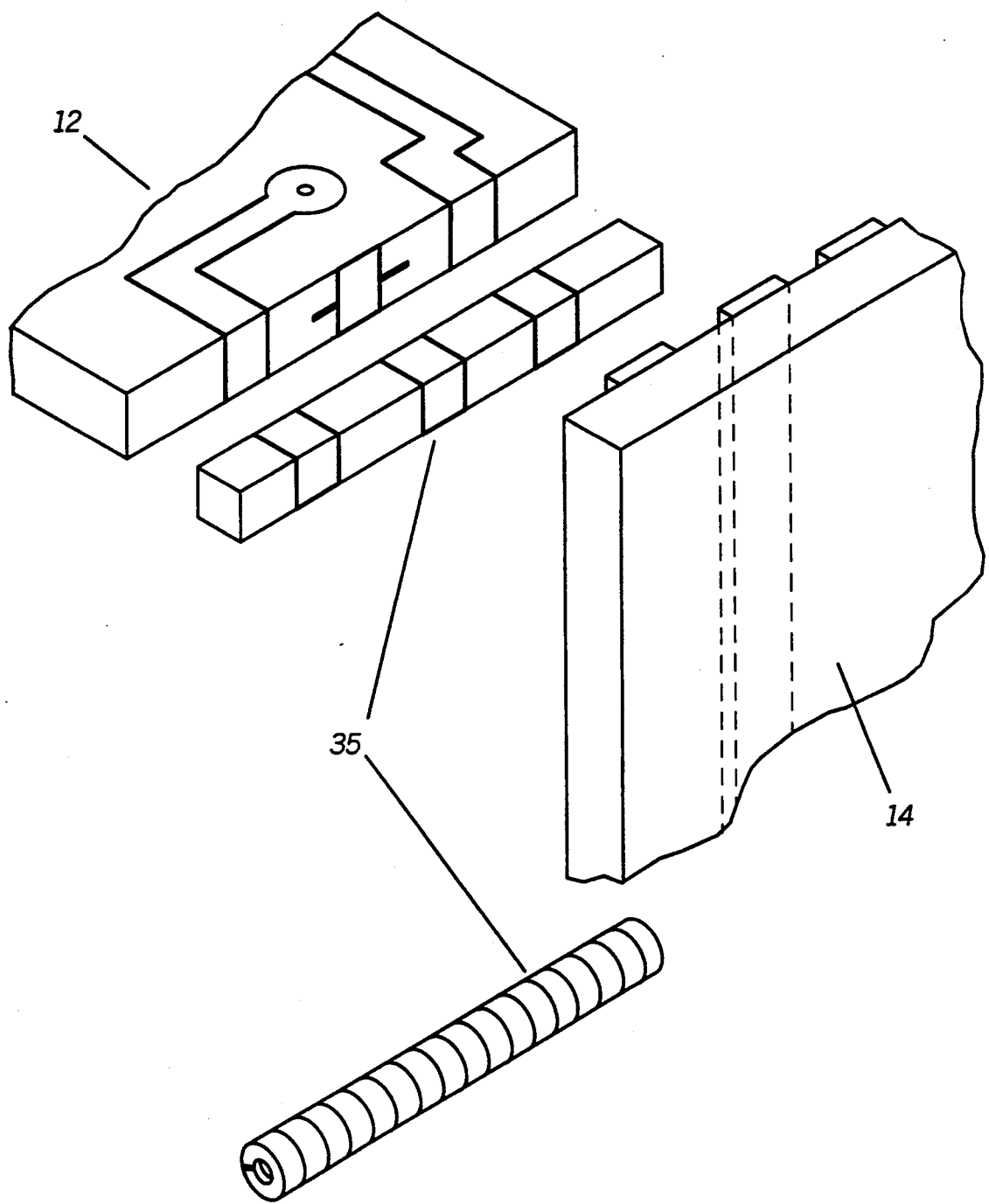
FIG. 3 is an isometric view of a preferred embodiment of the circuit interconnect system.

Continuing the preferred embodiment of the invention, FIG. 3 shows an electrically conductive, resilient member 35 disposed between the PCB 12 and the member 14. The resilient member 35 is typically a material such as a conductive elastomer well known to those skilled in the art, but may also be a spring or similar mechanism. The resilient member 35 serves to accommodate variations in the surfaces of the PCB 12 and the member 14. If the two surfaces are not smooth and parallel when they are mated, without the use of a resilient member 35 an electrical interconnection may not be effectively provided due to variations in the mating surfaces.

Figure 4:
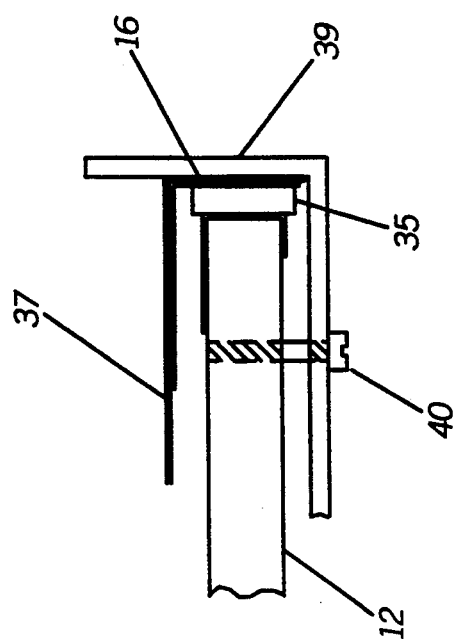
FIG. 4 is a side view of another embodiment in accordance with the present invention.

Referring now to FIG. 4, the PCB 12 is mated snugly against the resilient member or conductive elastomer 35 which is subsequently placed up against a flexible circuit 37. In this alternate embodiment of the invention, the entire assembly is forced against a housing wall 39 and held in place by a restraining means 40, such as a pin or a screw. The restraining means 40 serves to hold the PCB 12 up against and to compress the resilient member 35, thereby providing electrical interconnect between the PCB 12 and the flex circuit 37. The restraining means 40 may be any number of configurations such as clips, springs, standoffs, studs, rivets, or even adhesive materials. The purpose of the restraining means 40 is to hold the PCB 12 in a relatively fixed position with respect to the flex circuit 37 or any other member that it may be connected to.

Figure 5:
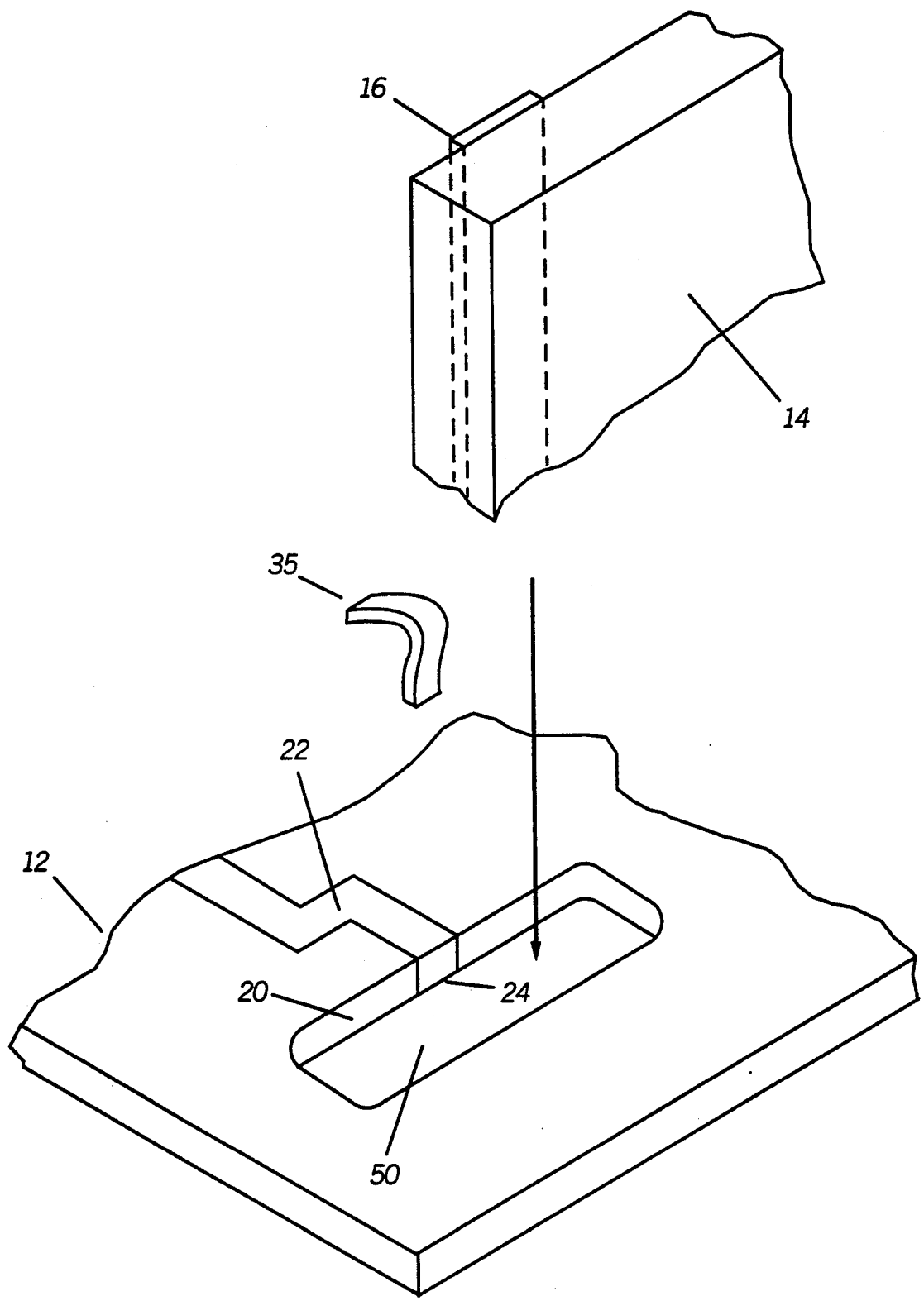
FIG. 5 is an isometric view of another embodiment of the circuit interconnect system.

Referring now to FIG. 5, still another embodiment of the invention is shown where the contact surface 24 is not on an exterior or perimeter edge of the PCB 12 as shown in previous embodiments but is on a slot or opening 50 routed or formed in the PCB 12. The connection of the circuit pattern 22 to the contact surface 24 is made as explained in the previous embodiments and the mating of conductive portions 16 of a second member 14 to the contact surface 24 is made by inserting the second member 14 into the opening 50. One skilled in the art will readily appreciate that if the opening 50 is appropriately sized, the member 14 will be held securely in place providing intimate electrical contact between the contact surface 24 and the electrically conductive portion 16. In this way the opening 50 serves not only to provide a vertical surface 20 for electrical interconnection but also as a restraining means for holding the member 14 in relation to the PCB 12. If desired, an electrically conductive, resilient member 35, such as a spring finger or elastomeric interconnect, may also be placed between the contact surface 24 and the electrically conductive portion 16.

Those skilled in the art will appreciate that the contact surfaces 24 can be made on a printed circuit board in a number of ways. One example of a method to form the contact surfaces would be to form any or all of the interior layers of the circuit board and then laminate it. Holes are then drilled in the circuit board through all the layers in order to provide future interconnection for plating. In addition, a slot is routed in the board a certain distance away from the holes. Electroless copper is then deposited into the holes on the surface of the board and on the edge of the slot on all surfaces. Portions of the electroless copper are then removed from the vertical surface of the slot by drilling or routing notches in the vertical wall. The board is then fabricated with conventional processing by imaging and plating circuit traces and annular rings, and also plating up the walls of the drilled holes. If desired, the circuit board panel can now be trimmed to remove the slot and provide a square edge on the vertical surface.

While the preferred embodiments of the invention have been illustrated and described, it will be clear that the invention is not so limited. Numerous modifications, changes, variations, substitutions and equivalents will occur to those skilled in the art without departing from the spirit and scope of the present invention.

What is claimed is:

1. A circuit interconnect system, comprising:
  a first circuit carrying substrate comprising a rigid insulating sheet having a circuit pattern, a portion of the circuit pattern wrapping around an edge of the insulating sheet and continuing on a vertical wall of the sheet to provide a contact surface;
  a second member having an electrically conductive portion;
  an electrically conductive elastomer between said contact surface and said electrically conductive portion; and
  the first circuit carrying substrate mated to the second member by aligning said contact surface to said electrically conductive portion, so as to provide an electrical interconnection between said circuit pattern and said electrically conductive portion.

2. The circuit interconnect system as described in claim 1, wherein the printed circuit board comprises a multilayer circuit board having two or more circuit patterns.

3. A circuit interconnect system, comprising:
- a first circuit carrying substrate comprising a rigid insulating sheet having a circuit pattern, a portion of the circuit pattern wrapping around an edge of the insulating sheet and continuing on a vertical wall of the sheet to provide a contact surface;
- a flexible printed circuit board having an electrically conductive portion; and
- the first circuit carrying substrate mated to the flexible printed circuit board by aligning said contact surface to said electrically conductive portion, so as to provide an electrical interconnection between said circuit pattern and said electrically conductive portion.

4. A circuit interconnect system, comprising:
- a printed circuit board comprising:
  - a rigid insulating sheet having a circuit pattern on a first layer, a portion of the circuit pattern electrically connected to a contact surface on a vertical edge of the printed circuit board;
  - one or more additional circuit layers, each layer separated from the circuit pattern by a dielectric layer and electrically connected to the contact surface;
  - a plated hole through the insulating sheet connecting the circuit layer to the additional circuit layers;
- a second member having an electrically conductive portion; and
- the printed circuit board mated to the second member by aligning the contact surface to the electrically conductive portion, so as to provide an electrical interconnection between the circuit pattern and the electrically conductive portion, the plated hole and the one or more additional circuit layers serving as redundant connections.

5. The circuit interconnect system as described in claim 4, further comprising a restraining means for mechanically holding the printed circuit board in relative position to the second member so as to maintain electrical interconnection between said circuit pattern and said electrically conductive portion.

6. The circuit interconnect system as described in claim 4, wherein the second member is selected from the group consisting of a rigid printed circuit board, a flexible printed circuit board, an electrical component, and a radio housing.

7. The circuit interconnect system as described in claim 4, further comprising an electrically conductive resilient member between said contact surface and said electrically conductive portion.

8. The circuit interconnect system as described in claim 7, wherein the electrically conductive resilient member comprises a conductive elastomer.

9. The circuit interconnect system as described in claim 8, wherein the printed circuit board comprises a multilayer circuit board having two or more circuit patterns.

10. A circuit interconnect system, comprising:
- a printed circuit board comprising a rigid insulating sheet having a first circuit pattern on an exterior major surface, a portion of the first circuit pattern extending around an edge of the printed circuit board and onto a vertical wall of the printed circuit board to provide a contact surface;
- a conductive elastomer positioned between the contact surface and a portion of a second circuit pattern on a substrate; and
- means for holding the printed circuit board in fixed position with respect to the substrate and compressing the conductive elastomer, to provide electrical connection between the first and second circuit patterns.

11. A circuit interconnect system, comprising:
- a printed circuit board comprising a rigid insulating sheet having a circuit pattern on an exterior major surface, a portion of the circuit pattern extending around an edge of the printed circuit board and onto a vertical wall of the printed circuit board to provide a contact surface;
- electrically conductive resilient means;
- the printed circuit board contact surface interconnected to an electrically conductive portion of a second member by the electrically conductive resilient means to provide electrical interconnection between the circuit pattern and the electrically conductive portion; and
- means for mechanically holding the printed circuit board in fixed position with respect to the second member and compressing the electrically conductive resilient means to maintain electrical interconnection between said circuit pattern and said electrically conductive portion.

12. The circuit interconnect system as described in claim 11, wherein the electrically conductive resilient member comprises a conductive elastomer.

13. The circuit interconnect system as described in claim 11, wherein the second member is a flexible printed circuit board.

14. The circuit interconnect system as described in claim 11, wherein the printed circuit board has an additional circuit pattern embedded in the interior of the insulating sheet.

15. The circuit interconnect system as described in claim 14, wherein the additional circuit pattern is electrically connected to the contact surface.

* * * * *